United States Patent [19]

Gray

[11] Patent Number: 4,731,538
[45] Date of Patent: Mar. 15, 1988

[54] MICROCHANNEL PLATE ION DETECTOR

[75] Inventor: John W. Gray, Ware, Mass.

[73] Assignee: Galileo Electro-Optics Corp., Sturbridge, Mass.

[21] Appl. No.: 876,696

[22] Filed: Jun. 20, 1986

[51] Int. Cl.$^4$ ............ H01J 3/14; H01J 40/00; H01J 43/02
[52] U.S. Cl. ............ 250/397; 250/305; 313/103 CM
[58] Field of Search ............ 250/305, 397; 313/361.1, 103 R, 103 CM, 105 CM; 315/111.31; 324/457

[56] References Cited

U.S. PATENT DOCUMENTS

| | | | |
|---|---|---|---|
| 3,477,023 | 11/1965 | Mortz | 250/305 |
| 4,227,087 | 10/1980 | Kurz | 250/397 |
| 4,357,536 | 11/1982 | Varma | 250/397 |
| 4,455,532 | 6/1984 | Gregory et al. | 250/305 |

Primary Examiner—Bruce C. Anderson

[57] ABSTRACT

An ion detector including a microchannel plate (MCP) with a hole through it provided along an undeflected trajectory of an ion beam, a faraday cup in position to receive ions passing through the hole, and a deflector to selectively deflect ions to multiplying channels of the MCP.

10 Claims, 3 Drawing Figures

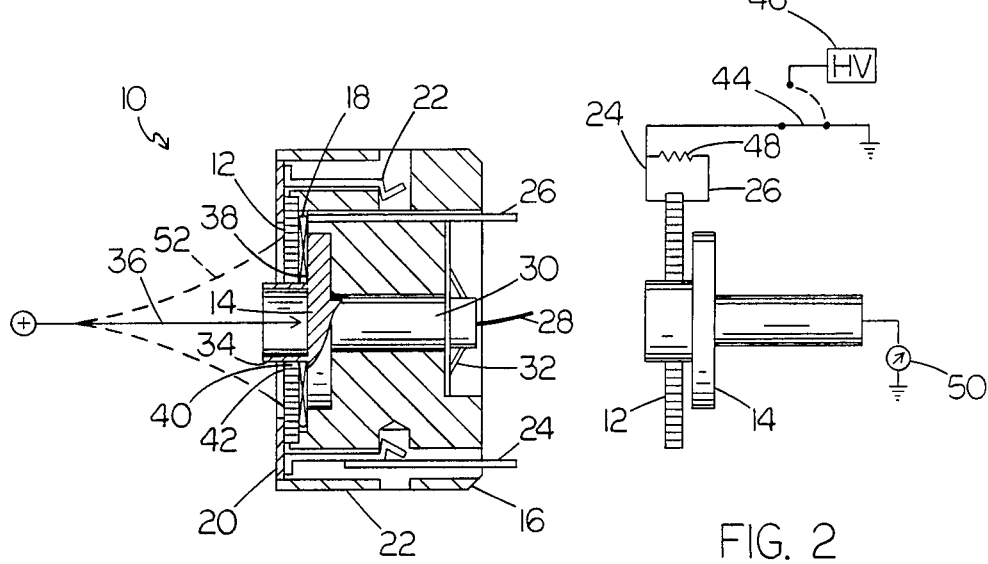
FIG. 1
FIG. 2
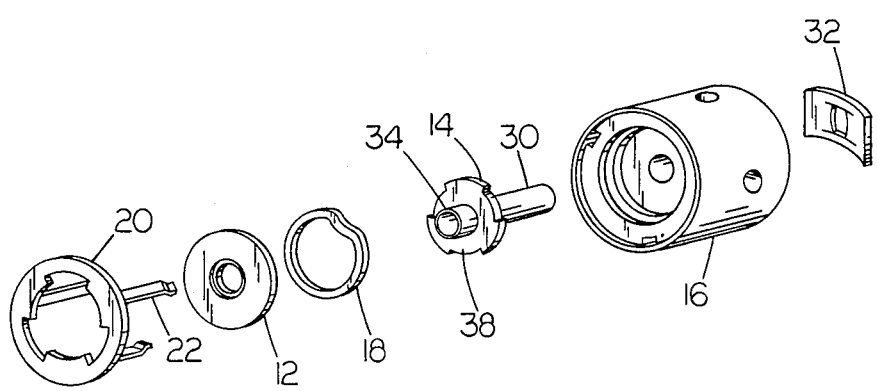
FIG. 3

MICROCHANNEL PLATE ION DETECTOR

FIELD OF THE INVENTION

The invention relates to ion detectors.

BACKGROUND OF THE INVENTION

Single-channel electron multipliers have often been used to detect ions. E.g., Kurz U.S. Pat. No. 4,227,087 discloses a single channel multiplier with an attached, adjacent faraday cup in position to receive an ion beam in an undeflected trajectory (to sense an unamplified beam), the beam being deflected to the multiplier when amplification is desired. The outputs of the multiplier and faraday cup are electrically common, and the device is switched between the amplification and faraday cup modes simply by applying to or removing from the input of the multiplier a large negative voltage of sufficient strength to deflect the beam.

Microchannel plates (MCPs) have also been used with adjacent faraday cups to detect ions, high negative voltages being used to deflect the ion beam from the faraday cup to the MCP.

SUMMARY OF THE INVENTION

I have discovered that ions can be advantageously detected by a simply constructed device by providing an MCP having a hole through it along the undeflected trajectory of an ion beam, a faraday cup at the hole to receive undeflected ions, and a deflector to deflect ions to the MCP.

In preferred embodiments an anode receiving multiplied electrons from the MCP is integral with the faraday cup; the MCP has a nonconductive annulus surrounding the hole; and a reduced lead glass resistor is connected between the output of the MCP and the anode.

Other advantages and features of the invention will be apparent from the following description of a preferred embodiment and from the claims.

DESCRIPTION OF THE PREFERRED EMBODIMENT

The drawings will be briefly described first.

Drawings

FIG. 1 is a diagramatic sectional view of an ion detector according to the invention.

FIG. 2 is a schematic showing the electrical connections to the FIG. 1 detector.

FIG. 3 is an exploded perspective view of the FIG. 1 detector.

STRUCTURE

Referring to FIG. 1 there is shown detector 10 including MCP 12, faraday cup/anode 14 and ceramic housing 16. MCP 12 and faraday cup/anode 14 are separated by wave spring 18, and these three components are held in place between metal retaining ring 20 and the front of housing 16, having stepped annular surfaces. Ring 20 is held against housing 16 by clips 22, one of which is connected to lead 24 to provide electrical connection to the input of MCP 12. Wave spring 18 is similarly connected to lead 26 to provide electrical connection to the output of MCP 12, and lead 28 is connected to stem 30 of faraday cup/anode 14, held against the rear of housing 16 by lock nut 32. Faraday cup/anode 14 includes faraday cup extension 34 along undeflected ion beam trajectory 36, and anode portion 38 in position to receive multiplied electrons from multiplying channels of MCP 12. Extension 34 passes through hole 40 of MCP 12, surrounded by nonconducting annulus 42, permitting close spacing of MCP 12 and extension 34.

Referring to FIG. 2, it is seen that lead 24 is selectively connectable via switch 44 to high negative voltage ($-1000$ V) source 46 or ground. Resistor 48, a reduced lead-oxide glass tube $\frac{1}{8}''$ long and $\frac{1}{8}''$ in diameter, is connected between the input and output of MCP 12 to provide a 50–200 V bias, the resistor having similar aging characteristics and temperature response to those of MCP 12. Output lead 28 is connected to current measuring circuit 50, capable of measuring very small currents (e.g., $10^{-12}$–$10^{-5}$ amp).

Referring to FIG. 3, it is seen that ring 20 has three recesses 54, and anode portion 38 has three aligned large radius portions, to increase the effective area of MCP 12, yet still permit it to be retained by ring 20. Only a single power supply is required, and the entire detector is packaged in a compact housing, requiring no screws or nuts.

OPERATION

In operation ions travel along undeflected trajectory 36 when switch 44 is in the faraday cup position shown in FIG. 2 and along trajectory 52 when switch 44 is in the other position (the amplification position), connecting high negative voltage source 46 to the input of MCP 12. The faraday cup mode is used to detect the strength of an ion beam that is so large as to saturate MCP 12 or to compare the unamplified beam current with the amplified beam current to determine the gain of the amplifier.

OTHER EMBODIMENTS

Other embodiments are within the scope of the following claims. E.g., more than one MCP could be provided in a cascade arrangement to cause sufficient amplification to count single ions.

What is claimed is:

1. An ion detector comprising
    a microchannel plate (MCP) made up of a plurality of microchannels for multiplying charged particles passing therethrough, said plate having a hole through it provided along an undeflected trajectory of an ion beam, said hole being substantially larger than said microchannels,
    a voltage source connectable to said MCP to achieve amplification of ions directed to said microchannels,
    a faraday cup in position to receive ions passing through said hole, and
    a deflector selectively deflect ions from said undeflected trajectory to multiplying channels of said MCP, said deflector comprising switch means connectable to selectively connect said voltage source to the input of said MCP.

2. The ion detector of claim 1 further comprising an anode for said MCP that is electrically connected to said faraday cup.

3. The detector of claim 2 wherein said anode is integral with said faraday cup.

4. The detector of claim 1 wherein said MCP has a nonconductive annulus surrounding said hole.

5. The detector of claim 1 further comprising a reduced lead resistor connected between the output of said MCP and the anode.

6. The detector of claim 3 further comprising an insulator housing on which said MCP and integral faraday cup/anode are mounted.

7. The detector of claim 6 further comprising a ring at the front of said MCP secured to said housing and holding said faraday cup/anode in place.

8. The detector of claim 7 further comprising clips connected to said ring and holding it in place.

9. The detector of claim 7 further comprising a wave spring between said MCP and anode.

10. The detector of claim 7 wherein said ring has plural recesses to increase the exposure of the MCP channels.

* * * * *